United States Patent
Suzuki

(10) Patent No.: US 8,823,562 B2
(45) Date of Patent: Sep. 2, 2014

(54) PARALLEL-TO-SERIAL CONVERTER CIRCUIT

(71) Applicant: Fujitsu Limited, Kawasaki (JP)

(72) Inventor: Shigeto Suzuki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/958,640

(22) Filed: Aug. 5, 2013

(65) Prior Publication Data

US 2014/0043174 A1 Feb. 13, 2014

(30) Foreign Application Priority Data

Aug. 10, 2012 (JP) ................... 2012-178951

(51) Int. Cl.
*H03M 9/00* (2006.01)
*H03L 7/07* (2006.01)
*H04Q 11/04* (2006.01)

(52) U.S. Cl.
CPC . *H03M 9/00* (2013.01); *H03L 7/07* (2013.01); *H04Q 11/04* (2013.01)
USPC ...... 341/101; 375/359; 375/355; 375/240.01; 370/536; 370/528; 370/366; 370/386; 348/489; 348/526

(58) Field of Classification Search
CPC ......... H03M 9/00; G06F 17/18; H04N 11/04; G11C 7/1075; H04Q 11/04; H03K 5/135; H03K 5/1534; H03K 17/007; H03L 7/07; H03L 7/0814; H04L 25/14; H04L 7/0008
USPC ........... 341/100–101; 348/489, 526; 370/366, 370/386, 528, 536; 375/355, 359, 240.01
See application file for complete search history.

(56) References Cited

U.S. PATENT DOCUMENTS 5,377,181 A * 12/1994 Rogers .......................... 370/366
5,583,574 A * 12/1996 Tanaka et al. ............. 375/240.01
6,437,725 B1 8/2002 Kwak et al.
7,551,107 B2 * 6/2009 Shim et al. .................... 341/101

FOREIGN PATENT DOCUMENTS

JP 11-017636 A 1/1999
JP 2002-280908 A 9/2002

* cited by examiner

*Primary Examiner* — Lam T Mai
(74) *Attorney, Agent, or Firm* — Fujitsu Patent Center

(57) ABSTRACT

A first multiplexer, at each given cycle, outputs a second input data signal, after outputting a first input data signal. A second multiplexer, at each given cycle, outputs a fourth input data signal, after outputting a third input data signal. The second multiplexer outputs the third input data signal at a timing that coincides with the timing at which the second input data signal is output from the first multiplexer. At each given cycle, a third multiplexer, after outputting the first input data signal and the second input data signal output from the first multiplexer, outputs the third input data signal and the fourth input data signal output from the second multiplexer.

5 Claims, 10 Drawing Sheets

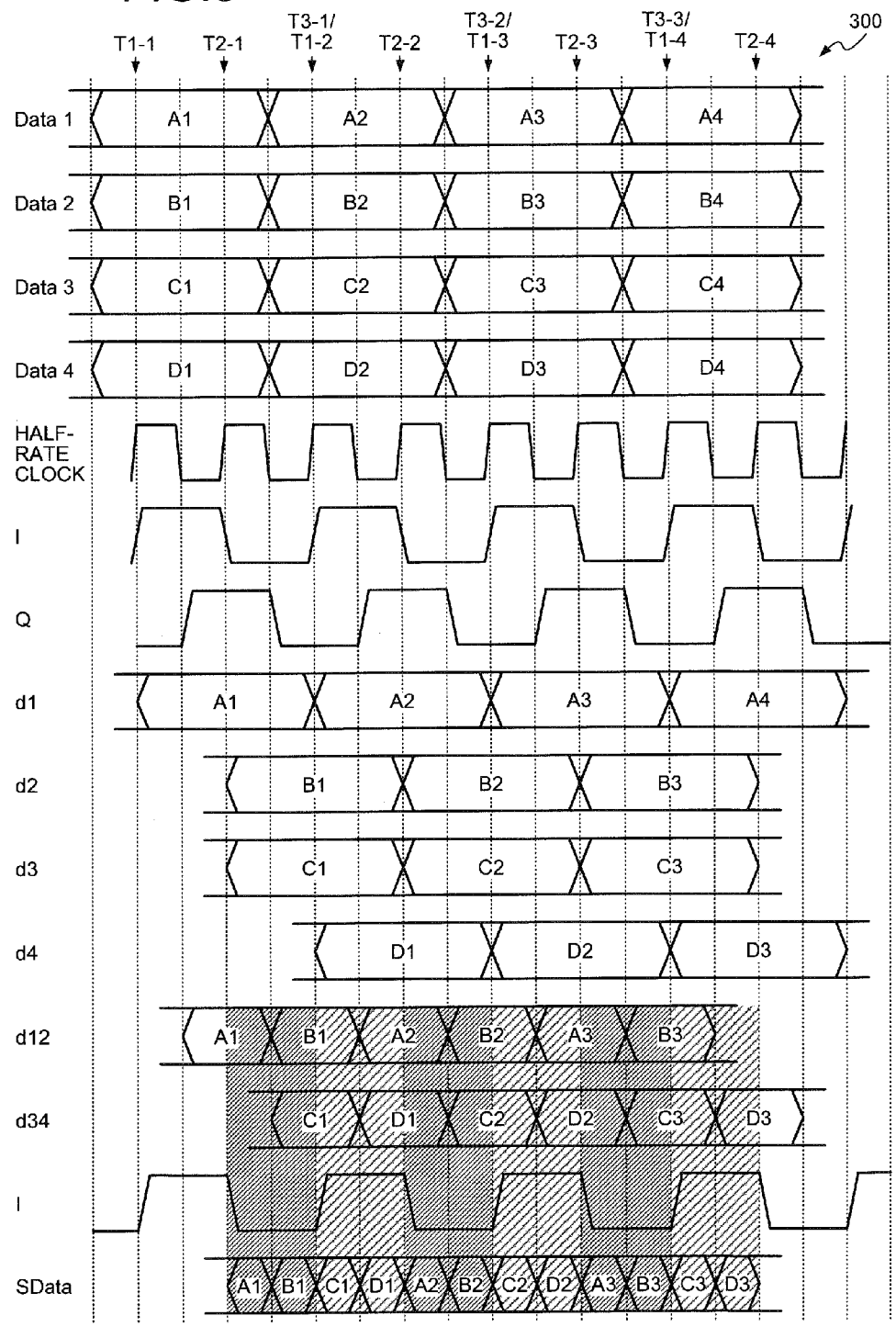

| INPUT D | CLK | OUTPUT Q |
|---|---|---|
| 0/1 | OTHER | STORE |
| 0 | ↑ (RISING EDGE) | 0 |
| 1 | ↑ (RISING EDGE) | 1 |

| INPUT D | CLK | OUTPUT Q |
|---|---|---|
| 0/1 | 0 | STORE |
| 0 | 1 | 0 |
| 1 | 1 | 1 |

PARALLEL-TO-SERIAL CONVERTER CIRCUIT

CROSS REFERENCE TO RELATED APPLICATIONS

This application is based upon and claims the benefit of priority of the prior Japanese Patent Application No. 2012-178951, filed on Aug. 10, 2012, the entire contents of which are incorporated herein by reference.

FIELD

The embodiments discussed herein are related to a parallel-to-serial converter circuit.

BACKGROUND

Conventionally in the communication of data, a data transmission apparatus may use a multiplexer to convert parallel signals into a serial signal for transmission to a receiving apparatus. For example, a technology is known in which multiple stages of multiplexers that convert 2 parallel signals into a serial signal according to the value of a clock signal are disposed such that multiplexers farther downstream have clock signals of higher frequencies, whereby staged multiplexing is performed (for example, refer to Japanese Laid-Open Patent Publication No. H11-17636).

A further technology is known in which a converter converts parallel signals into a serial signal (for example, refer to Japanese Laid-Open Patent Publication No. 2002-260908).

Nonetheless, if the frequency of the clock signal provided to a multiplexer is high, the operation of the multiplexer may become unstable.

SUMMARY

According to an aspect of an embodiment, a parallel-to-serial converter circuit converts parallel first to fourth input data signals into a serial signal. The parallel-to-serial converter circuit includes a first latch group that based on a first clock signal of a given cycle, outputs the first input data signal at a first timing of the given cycle; a second latch group that outputs the second input data signal at a second timing that is of the given cycle and delayed by half a cycle of the given cycle relative to the first timing; a third latch group that outputs the third input data signal at the second timing; a fourth latch group that outputs the fourth input data signal at a third timing that is of the given cycle and delayed by one given cycle relative to the first timing; a first multiplexer that at each given cycle and based on a second clock signal having a phase that differs by ¼ cycle from the phase of the first clock signal, outputs the second input data signal, after outputting the first input data signal; a second multiplexer that at each given cycle and based on the second clock signal, outputs the fourth input data signal, after outputting the third input data signal and that outputs the third input data-signal at a timing that coincides with the timing at which the second input data signal is output from the first multiplexer; and a third multiplexer that at each given cycle and based on the first clock signal, outputs the third and the fourth input data signals output from the second multiplexer, after outputting the first and the second input data signals output from the first multiplexer.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 3 is a diagram depicting an example of a timing chart of one operation of the parallel-to-serial converter circuit according to the first example;

DESCRIPTION OF EMBODIMENTS

Preferred embodiments will be explained with reference to the accompanying drawings.

Figure 1:
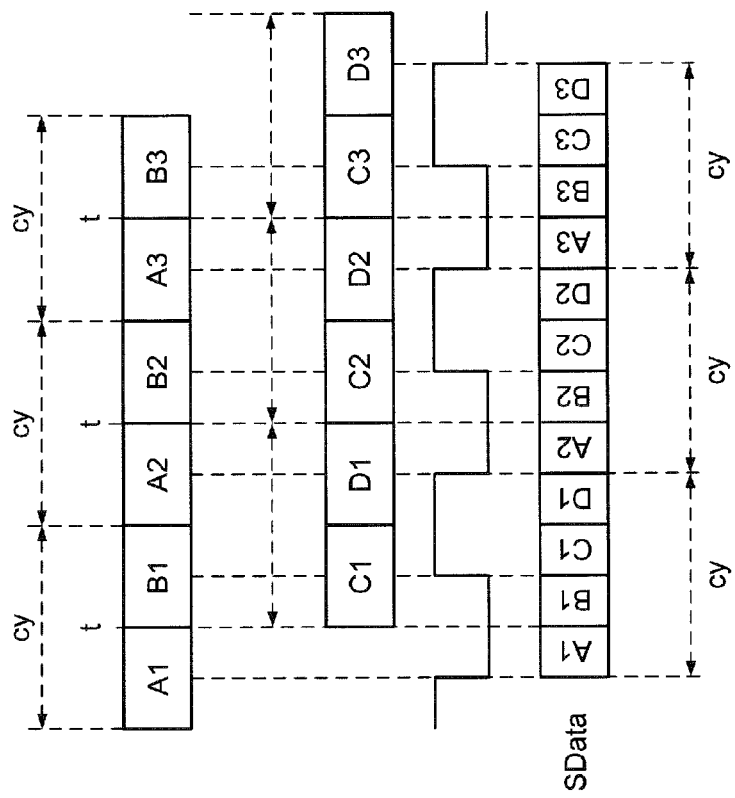
FIGS. 1A and 1B axe diagrams depicting an example of operation of a parallel-to-serial converter circuit according to an embodiment.

FIGS. 1A and 1B are diagrams depicting an example of operation of a parallel-to-serial converter circuit according to an embodiment. A parallel-to-serial converter circuit 100 converts into a serial data signal_SData, parallel first to fourth input data signals_Data 1 to 4, the data of each of the first to the fourth input data signals_Data 1 to 4 changing at each given cycle cy. Although a detailed example of a multiplexer will be described hereinafter, the parallel-to-serial converter circuit 100 is equipped with 3 multiplexers that convert 2 parallel input data signals into a serial signal. Among the 3 multiplexers, the upstream multiplexers are regarded as a first multiplexer and a second multiplexer, and the downstream multiplexer is regarded as a third multiplexer.

In the embodiment, the downstream third multiplexer switches between output sources, i.e., the 2 upstream multiplexers, to thereby stagger the timing of the 4 input data signals such that the data of 2 signals are output. As a result, the frequency of the clock provided to the downstream multiplexer can be reduced.

At each given cycle cy, the first multiplexer, after outputting the first input data signal_Data 1, outputs the second input data signal_Data 2. At each given cycle cy, the second multiplexer, after outputting the third input data signal_Data 3, outputs the fourth input data signal_Data 4. The second multiplexer outputs the third input data signal_Data 3 at a timing that coincides with the timing at which the second input data signal_Data 2 is output from the first multiplexer. At each given cycle cy, the third multiplexer, after outputting the first, input data signal_Data 1 and the second input data signal_Data 2 output from the first multiplexer, outputs the third input data signal_Data 3 and the fourth input data signal_Data 4 output from the second multiplexer.

Thus, since the cycle of the clock provided to the multiplexer farthest downstream may be identical to the cycle of the clock provided to the multiplexer one stage upstream from the multiplexer farthest downstream, the frequency of the clock provided to the multiplexer farthest downstream can be reduced, whereby the operation of the multiplexer can be stabilized.

In a first example, the parallel-to-serial converter circuit 100 and a timing chart 300 related to an operation example will be described.

Figure 2:
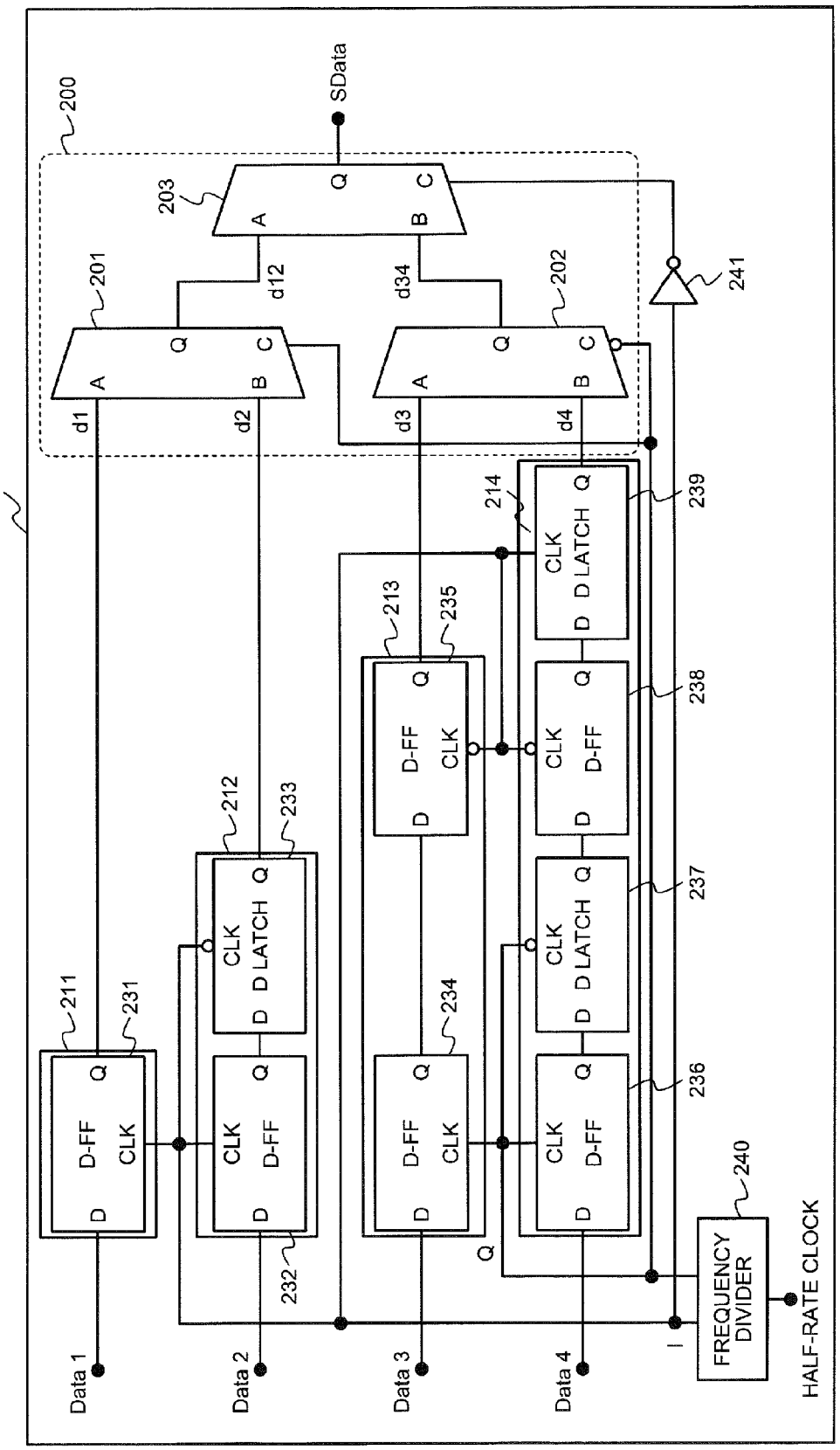
FIG. 2 is a diagram depicting an example of the parallel-to-serial converter circuit according to a first example.

FIG. 2 is a diagram depicting an example of the parallel-to-serial converter circuit according to the first example. In FIG. 2, clock signals are depicted to be inverted and input to clock input terminals CLK "o" of D latches 233, 237 and D-FFs 235, 238. FIG. 3 is a diagram depicting an example of a timing chart of one operation of the parallel-to-serial converter circuit according to the first example. The parallel-to-serial converter circuit 100 multiplexes parallel input data signals into the serial data signal_SData. The parallel-to-serial converter circuit 100 has a first latch group 211, a second latch group 212, a third latch group 213, a fourth latch group 214, a multiplexer 200, and a frequency divider 240. The multiplexer 200 has a first multiplexer 201, a second multiplexer 202, and a third multiplexer 203. In FIG. 3, respective inverted clock signals of a first clock signal I and a second clock signal Q are not depicted.

Here, as one example and as depicted in the timing chart 300, data A1 to data A4 are input as the first input data signal_Data 1; and data B1 to data B4 are input as the second input, data signal_Data 2. Further, as depicted in the timing chart 300, data C1 to data C4 are input as the third input data signal_Data 3; and data D1 to data D4 are input as the fourth input data signal_Data 4.

The frequency divider 240 generates the first clock signal I, which is twice a half rate clock signal (half-rate clock). The frequency divider 240 further generates the second clock signal Q, which has a phase differing from the phase of the first clock signal I. For example, the second clock signal Q is a signal having a phase that differs by 90 degrees from the first clock signal I. As a result, the output period of data each signal output from the serial data signal_SData can be of the same length. For example, the second clock signal Q has a phase that is delayed by 90 degrees relative to that of the first clock signal I. In the timing chart 300, vertical dotted lines are drawn every ¼ cycle of the first clock signal I.

At first a timing of the given cycle cy, the first latch group 211 outputs the first input data signal_Data 1 according to the first clock signal I of the given cycle cy. For example, the first latch group 211 is a flip flop (D-FF) 231. The D-FF 231 retains the value ox the first input data signal_Data 1 at the rising edge of the first clock signal I. A signal output from the first latch group 211 is regarded as d1. Herein, a simple description will be given of the D-FFs and the D latches used in the first example.

Figures 4A, 4B, 4C:
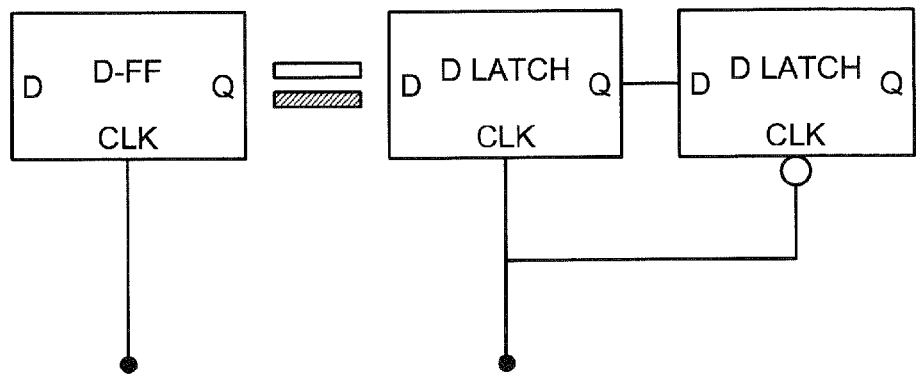
FIG. 4A is a diagram of a D-FF and D latches.
FIG. 4B is a truth table of the D-FF.
FIG. 4C is a truth table of a D latch.

FIG. 4A is a diagram of a D-FF and D latches. For example, the D-FF has two D latches and at the D-FF, the two D latches are connected in series. The clock signal input to the clock input terminal CLK of the D-FF is input (as is) to the clock input terminal CLK of the upstream D latch. The clock signal input to the clock input terminal CLK of the D-FF is inverted and input to the clock input terminal CLK of the downstream D latch.

FIG. 4B is a truth table of the D-FF. According to the truth table of the D-FF depicted in FIG. 4B, the D-FF outputs (as is) from a data output terminal Q, the value of a data signal D input to a data input terminal D when the clock signal input to the clock input terminal CLK is at the rising edge from 0 to 1. During times other than when the clock signal input to the clock input terminal CLK is not at the rising edge from 0 to 1, a data signal Q output from the data output terminal Q does not change (stores). The truth table of the D-FF depicted in FIG. 4B is an example for a case where the D-FF operates at the rising edge of a clock signal and therefore, without limitation hereto, various modifications are possible. For example, the D-FF may operate at the failing edge of the clock signal.

FIG. 4C is a truth table of a D latch. According to the truth table of the D latch depicted in FIG. 4C, the D latch does not change (stores) the data signal Q output from the data output terminal Q, if the clock signal input to the clock input terminal CLK is 0, regardless of whether the data signal D input to the data input terminal D is 0 or 1. If the clock signal CLK is 1 and the input data signal D is 0, the data signal Q output from the D latch becomes 0. If the clock signal CLK is 1 and the input data signal D is 1, the data signal Q output from the D latch becomes 1. Here, if the clock signal CLK is 1, the D Latch latches the value of the input data signal D. The truth table of the D latch depicted in FIG. 4C is one example simplifying a function of the D latch and therefore, without limitation hereto various modifications are possible. For example, a reset signal may foe included.

In the timing chart 300, points of the first timing or the given cycle cy are indicated as T1-$i$ (i ≥1). Further, in the timing chart 300, the signal d1 output from the first latch group 211 is the data A1 at the first timing point T1-1, is the data A2 at the first timing point T1-2, is the data A3 at the first timing point T1-3, and is the data M at the first timing point T1-4.

The second latch group 212 outputs the second input data signal_Data 2 at a second timing that is of the given cycle cy and delayed by half of a cycle of the given cycle cy relative to the first timing T1. For example, the second latch group 212 has a D-FF 232 and a D latch 233. The D-FF 232 stores the data signal Data2 according to the rising edge of the first clock signal I. Since the first clock signal I is inverted and input to the clock input terminal CLK, the D latch 233 stores the value of the signal output from the D-FF 232 according to the falling edge of the first clock signal I. The signal output from the second latch group 212 is regarded as d2.

In the timing chart 300, points of the second timing of the given cycle cy are indicated as T2-$i$ (i ≥1). Further in the timing chart 300, the signal d2 output from the second latch group 212 is the data B1 at the second timing point T2-1, is the data B2 at the second timing point T2-2, and is the data B3 at second timing point T2-3.

The third latch group 213 outputs the third input data signal_Data 3 at the second timing T2 of the given cycle cy. For example, the third latch group 213 has a D-FF 234 and a D-FF 235. The D-FF 234 stores the value of the third input data signal_Data 3 at the rising edge of the second clock signal Q. Since the first clock signal I is inverted and input to the clock input terminal CLK, the D-FF 235 stores the value of the signal output from the D-FF 234 at the falling edge of the first clock signal I. The signal output from the third latch group 213 is regarded as d3.

In the timing chart 300, the signal d3 output from the third latch group 213 is the data C1 at the second timing point T2-1, is the data C2 at the second timing point T2-2, and is the data C3 at the second timing point T2-3.

The fourth latch group 214 outputs the fourth input data signal_Data 4 at a third timing that is of the given cycle cy and delayed by one given cycle cy relative to the first timing T1. For example, the fourth latch group 214 has a D-FF 236, a D latch 237, a D-FF 238, and a D latch 239. The D-FF 236 stores the value of the fourth input data signal_Data 4 at the rising edge of the second clock signal Q. Since the second clock signal Q is inverted and input to the clock input terminal CLK, the D latch 237 latches at the failing edge of the second clock signal Q, the value of the signal output from the D-FF 236. Since the first clock signal I is inverted and input to the clock input terminal CLK, the D-FF 238 stores at the failing edge of the first clock signal I, the value of the signal output from the D latch 237. The D latch 239 latches at the rising edge of the first clock signal I, the value of the signal, output from the D-FF 238. The signal output from the fourth latch group 214 is regarded as d4.

In the timing chart 300, point of the third timing of the given cycle cy are indicated as T3-$i$ ($i \geq 1$). Further, in the timing chart 300, the signal d4 output from the fourth latch group 214 is the data D1 at the third timing point T3-1, is the data D2 at the third timing point T3-2, and is the data D3 at the third timing point T3-3.

At each given cycle cy, the first multiplexer 201, after outputting the first input data signal_Data 1 output from the first latch group 211, outputs the second input data signal_Data 2 output from the second latch group 212. For example, according to the second clock signal Q of the given cycle cy, the first multiplexer 201 alternately outputs at half cycles of the given cycle cy, the signal d1 output from the first latch group 211 and the signal d2 output from the second latch group 212. For example, if the value of the second clock signal Q of the given cycle cy is 1, the first multiplexer 201 outputs the first input data signal_Data 1 output from the first latch group 211. If the value of the second clock signal Q is 0, the first multiplexer 201 outputs the second input data signal_Data 2 output from the second latch group 212. In this example, the signal output from the first multiplexer 201 is regarded as d12.

In the timing chart 300, the data A of the first clock signal I and the data B of the second clock signal Q are alternately output at half cycles of the given cycle cy, via the signal d12.

At each given cycle cy, the second multiplexer 202, after outputting the third input data signal_Data 3 output from the third latch group 213, outputs the fourth input data signal_Data 4 output from the fourth latch group 214. For example, at half cycles of the given cycle cy, the second multiplexer 202 alternately outputs the signal d3 output from the third latch group 213 and the signal d4 output from the fourth latch group 214. If the value of the second clock signal Q of the given cycle cy is 0, the second multiplexer 202 outputs the third input data signal_Data 3 output from the third latch group 213. If the value of the second clock signal Q of the given cycle cy is 1, the second multiplexer 202 outputs the fourth input data signal_Data 4 output from the fourth latch group 214. In this example, the signal output from the second multiplexer 202 is regarded as d34.

In the timing chart 300, the data C of a third clock signal and the data D of a fourth clock signal are alternately output at half cycles of the given cycle cy, via the signal d34.

The third multiplexer 203 is the multiplexer farthest downstream in the parallel-to-serial converter circuit 100 and outputs the serial data signal_SData. At each given cycle cy, the third multiplexer 203, after outputting the first and the second input data signals output from the first multiplexer 201, outputs the third and the fourth input data signals output from the second multiplexer 202. According to the first clock signal I, the third multiplexer 203 alternately outputs at half cycles ox the given cycle cy, the signal d12 output from the first multiplexer 20 and the signal d34 output from the second multiplexer 202. For example, if the value of the first clock signal I is 0, the third multiplexer 203 outputs the signal d12 output from the first multiplexer 201. In the timing chart 300, areas representing the output of the signal d12 as the serial data signaled Data are indicated by fine hatching. For example, if the value of the first clock signal I is 1, the third multiplexer 203 outputs the signal d34 output from the second multiplexer 202. In this example, the signal output from the third multiplexer 203 is regarded as SData. In the timing chart 300, areas representing the output of the signal d34 as the serial, data signal_SData are indicated by coarse hatching.

In the timing chart 300, the signal_SData has the value of the signal d12 if the value of the first clock signal I is 0, and has the value of the signal d34 if the value of the first clock signal I is 1. The data A of the first input data signal_Data 1, the data B of the second input data signal_Data 2, the data C of the third input data signal_Data 3, and the data D of the fourth input data signal_Data 4 are sequentially output at ¼ cycles of the given cycle cy.

Figure 5:
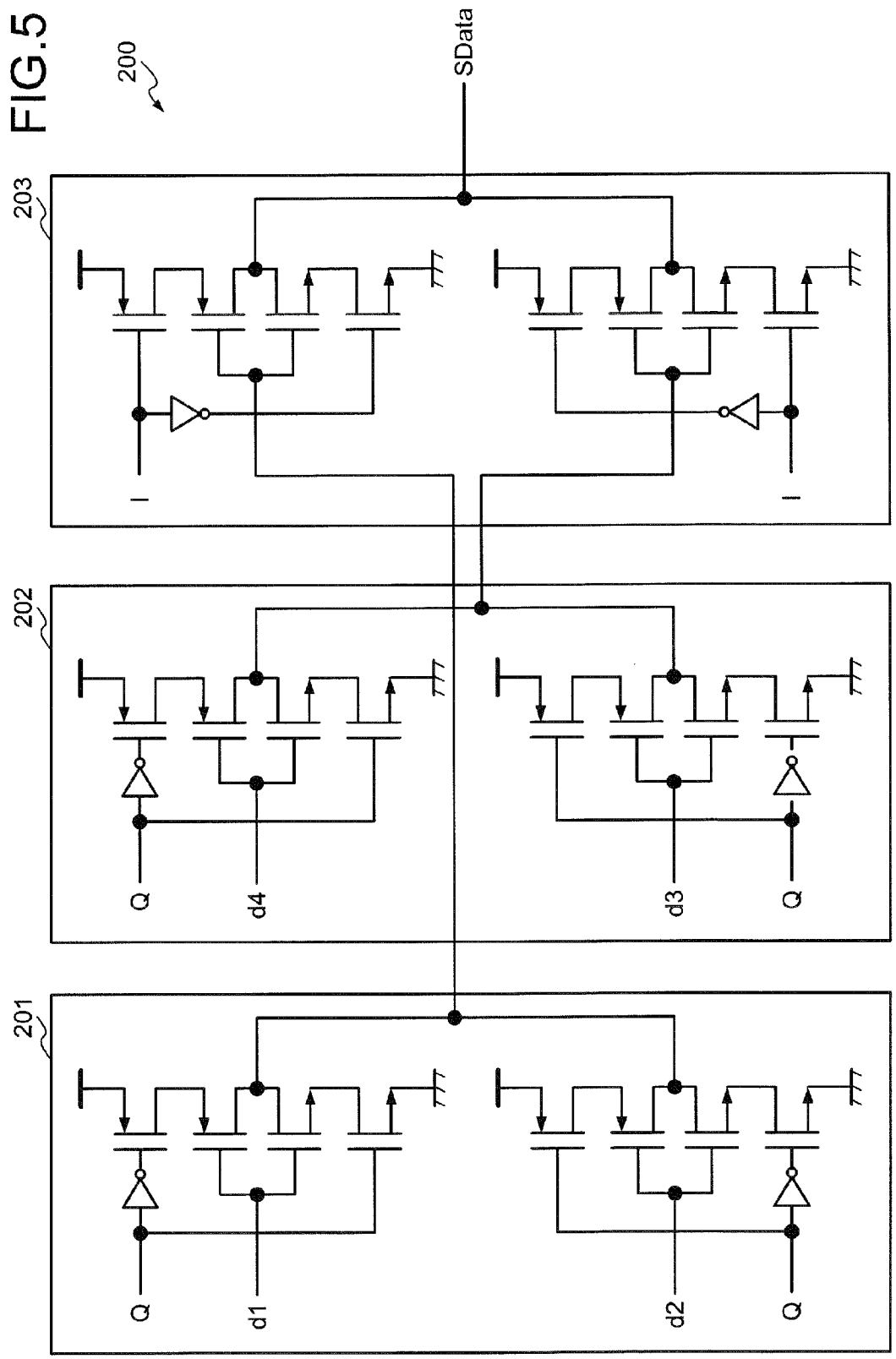
FIG. 5 is a diagram depicting a detailed example of a first multiplexer to a third multiplexer.

FIG. 5 is a diagram depicting a detailed example of the first multiplexer to the third multiplexer. The first multiplexer 201, the second multiplexer 202, and the third multiplexer 203 respectively have 2 circuits connected in series to 4 transistors. Herein, the serial connection of the transistors is assumed to be vertical.

The number of stacked transistors that the first multiplexer 201, the second multiplexer 202, and the third multiplexer 203 respectively have is at most 4 tiers and therefore, compared to a multiplexer having stacked transistors of 5 or more tiers, the first multiplexer 201, the second multiplexer 202, and the third multiplexer 203 operate stably even if the voltage is reduced.

According to the parallel-to-serial converter circuit of the first example, the frequency of the clock signal provided as a selection signal to the downstream multiplexer and the frequency of the clock signal provided as a selection signal to the upstream multiplexers are the same. Consequently, even when staged multiplexing is performed by multiplexers that convert 2 parallel input-data signals into a serial signal, the frequency of the clock provided to the multiplexer farthest downstream can be reduced, thereby enabling operation of the multiplexer to be stable.

In the first example, although a case in which the D-FF stores data at the timing of the rising edge of the clock signal input to the clock input terminal CLK is taken as an example and the timing of each signal is staggered, without limitation hereto, for example, a D-FF may be used that stores data at the timing of the falling edge of the clock; signal and based on the timing of the failing edge, various modifications of the configuration of each of the latch groups of the multiplexer are possible.

In a second example, a parallel-to-serial converter circuit will be described that can reduce the frequency of the clock provided to the multiplexer farthest downstream, when staged multiplexing by multiplexers converting 2 parallel signals into a serial signal is performed to convert 8 parallel input data signals into a serial signal.

Figure 6:
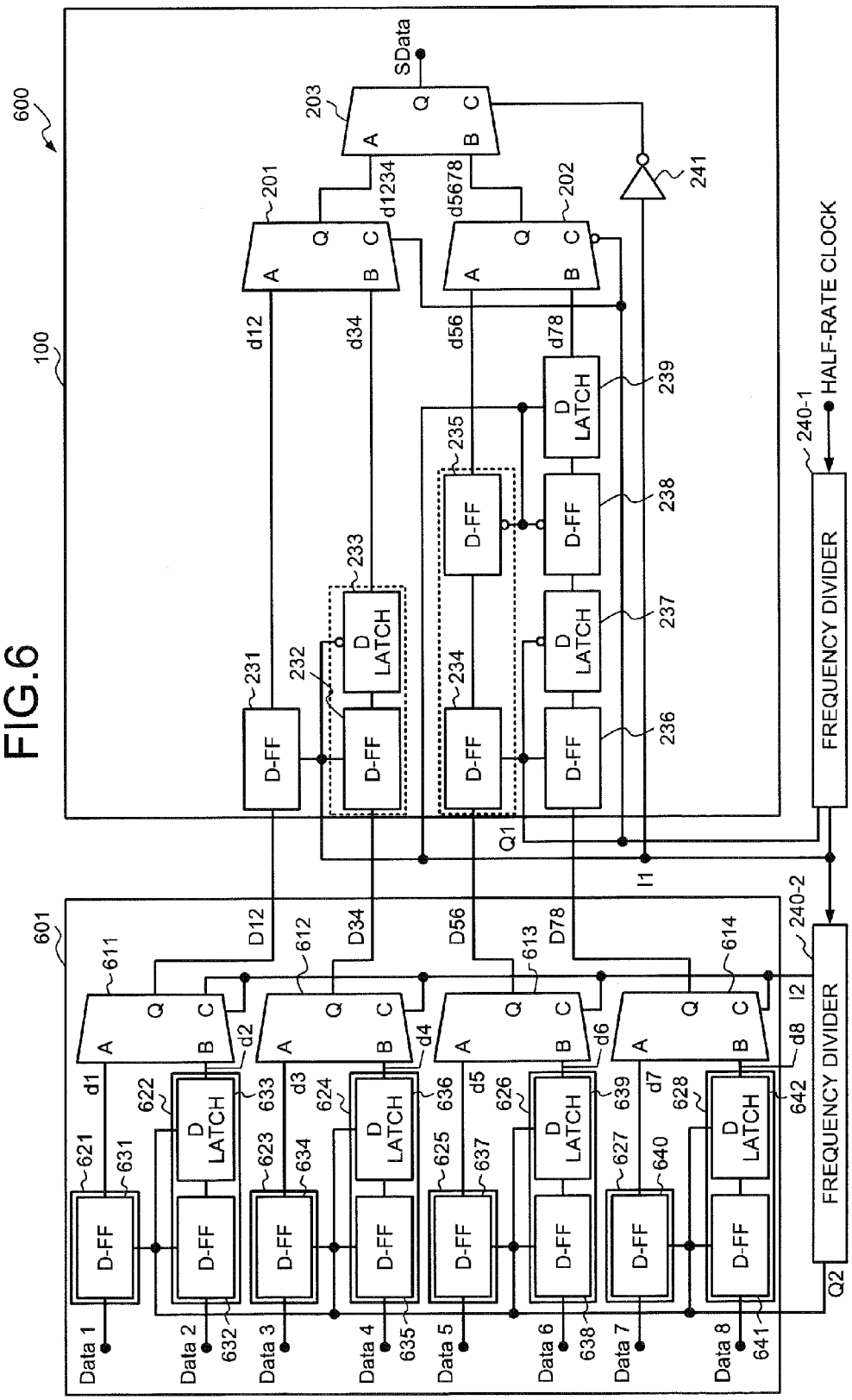
FIG. 6 is a diagram of an example of the parallel-to-serial converter circuit according to a second example.
Figure 7:
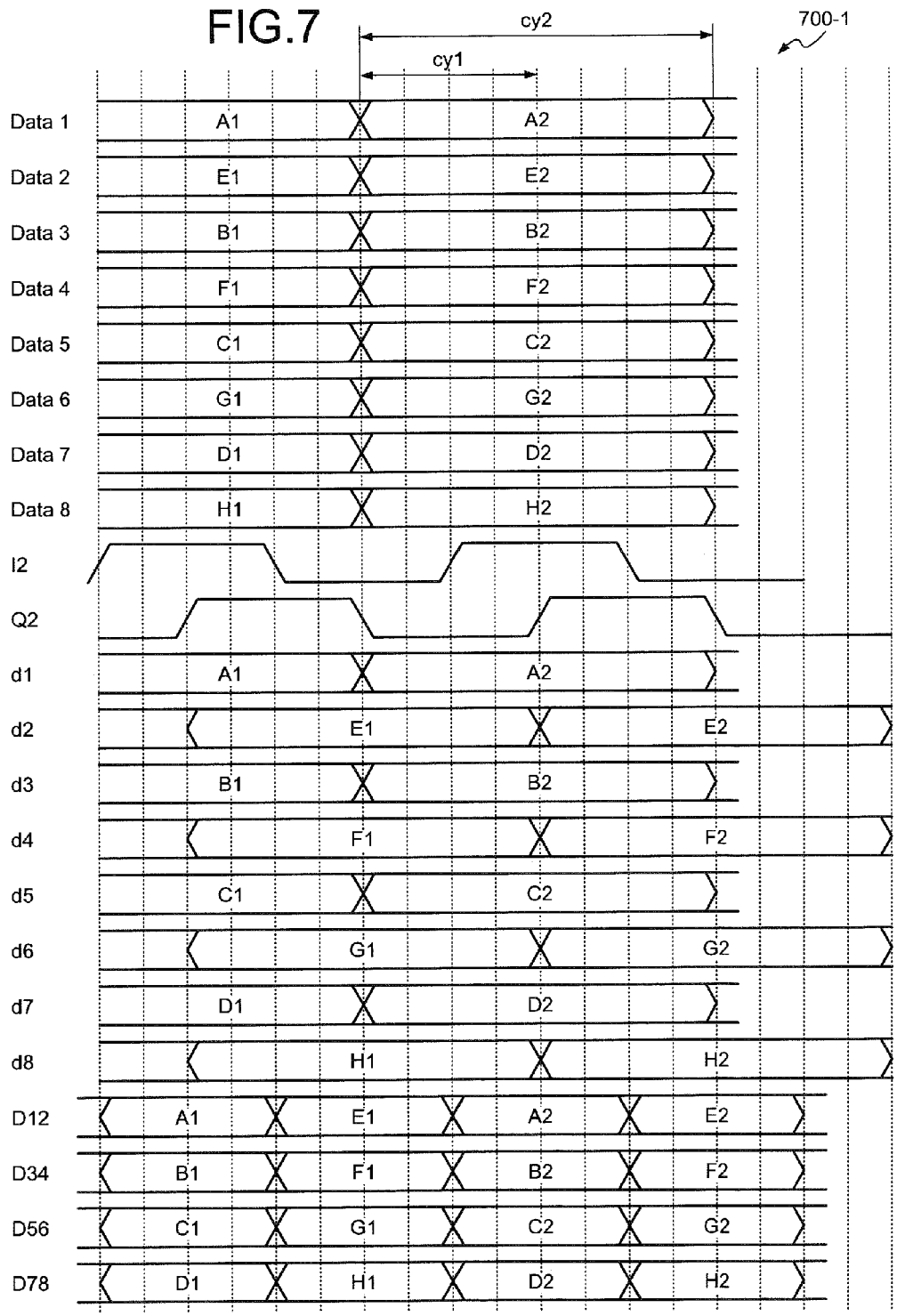
FIGS. 7 and 8 are diagrams depicting an example of a timing chart of one operation of the parallel-to-serial converter circuit, according to the second example.
Figure 8:
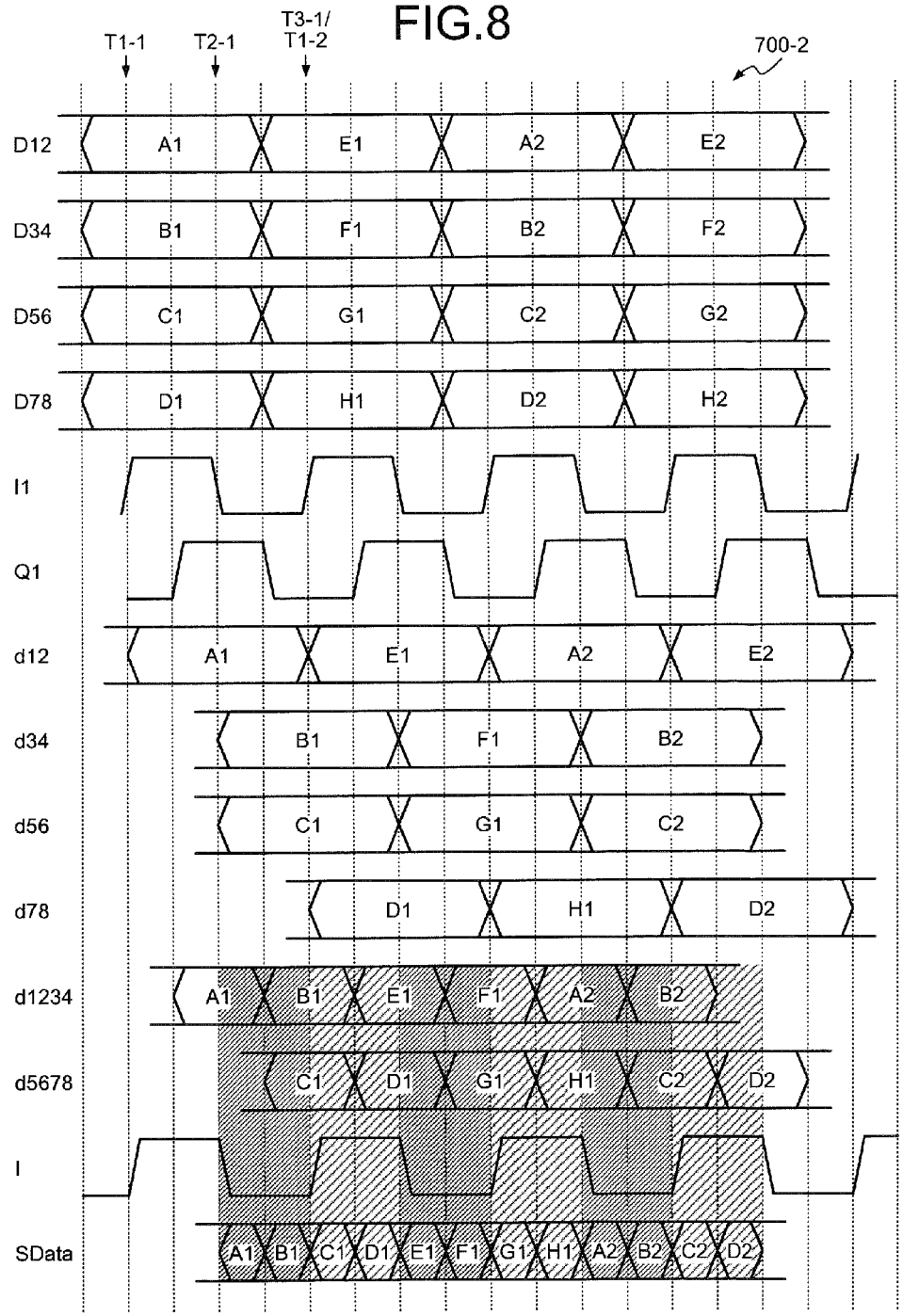

FIG. 6 is a diagram of an example of the parallel-to-serial converter circuit according to the second example, FIGS. 7 and 8 are diagrams depicting an example of a timing chart of one operation of the parallel-to-serial converter circuit according to the second example. In the example depicted in FIG. 6, a parallel-to-serial converter circuit 600 converts into a serial input data signal, first to eighth input data signals_Data1 to Data8 that respectively vary at a second given cycle cy2 that is twice a first given cycle cy1. The parallel-to-serial converter circuit 600 has a multiplexer 601, the parallel-to-serial converter circuit 100, the frequency divider 240-1, and the frequency divider 240-2. The multiplexer 601 multiplexes the data of 8 parallel input data signals into 4 parallel input data signals. In a timing chart 700 depicted in FIGS. 7 and 8, at ¼ cycles of the first clock signal I, dotted vertical lines are drawn.

The frequency divider 240-2 outputs a third clock signal I2, which is of the second given cycle and obtained by frequency dividing a first clock signal I1 output from the frequency divider 240-1. The frequency divider 240-2 outputs a fourth clock signal Q2 having a phase that differs by 90 degrees from the phase of the third clock signal I2.

The multiplexer 601 has a fifth latch group 621, a sixth latch group 622, a seventh latch group 623, an eighth latch group 624, a ninth latch group 625, a tenth latch group 626, an eleventh latch group 627, and a twelfth latch group 628. The multiplexer 601 has a fourth multiplexer 611, a fifth multiplexer 612, a sixth multiplexer 613, and a seventh multiplexer 614.

At each second given cycle cy2, the fifth latch group 621 stores and outputs to the fourth multiplexer 611, the first input data signal_Data 1. For example, the fifth latch group 621 is a D-FF 631. The D-FF 631 stores the first input data signal_Data 1 at the rising edge of the fourth clock signal Q2. The signal output from the fifth latch group 621 is regarded as d1. In the timing chart 700-1 depicted in FIG. 7, the data A1 and the data A2 are input at the second given cycle cy2 as the first input data signal_Data 1.

At each second given cycle cy2, the sixth Latch group 622 outputs the second input data signal_Data 2 at a timing that is delayed by a half cycle of the second given cycle cy2 relative to the timing at which the fifth latch group 621 outputs the first input data signal_Data 1. For example, the sixth latch group 622 has a D-FF 632 and a D latch 633. At the rising edge of the fourth clock signal Q2, the D-FF 632 stores the second input data signal_Data 2 and the D latch 633 latches the signal output from the D-FF 632. The signal output from the sixth latch group 622 is regarded as 62. In the timing chart 700-1, a data E1 and a data E2 are input at the second given cycle cy2 as the second input data signal_Data 2.

After outputting the first input data signal_Data 1, the fourth multiplexer 611 outputs the second input data signal_Data 2. For example, at half cycles of the second given cycle cy2 (the first given cycle cy1), the fourth multiplexer 611 switches the output of the first input data signal_Data 1 and the output of the second input data signal_Data 2. Further, for example, if the value of the third clock signal I2 is 1, the fourth multiplexer 611 outputs the signal output from the fifth latch group 621, and if the value of the third clock signal I2 is 0, the fourth multiplexer 611 outputs the signal from the sixth latch group 622. The signal output from the fourth multiplexer 611 is regarded as D12. In the timing chart 700-1, the first input data signal_Data 1 and the second input data signal_Data 2 are alternately output at each first given cycle cy1 as the signal D12.

At each second given cycle cy2, the seventh latch group 623 stores and outputs to the fifth multiplexer 612, the third input data signal_Data 3. For example, the seventh latch group 623 is a D-FF 634. The D-FF 634 stores the third input data signal_Data 3 at the rising edge of the fourth clock signal Q2. The signal output from the seventh latch group 623 is regarded as d3. In the timing chart 700-1, the data B1 and the data B2 are input at the second given cycle cy2 as the third input data signal_Data 3.

At each second given cycle cy2, the eighth latch group 624 outputs the fourth input data signal_Data A at a timing that is delayed by a half cycle of the second given cycle cy2 relative to the timing at which the seventh latch group 623 outputs the third input data signal_Data 3. For example, the eighth latch group 624 has a D-FF 635 and a D latch 636. At the rising edge of the fourth clock signal Q2, the D-FF 635 stores the fourth input data signal_Data 4 and the D latch 636 latches the signal output from the D-FF 635. The signal output from the eighth latch group 624 is regarded as d4. In the timing chart 700-1, a data F1 and a data F2 are input at the second given cycle cy2 as the fourth input data signal_Data 4.

After outputting the third input data signal_Data 3, the fifth multiplexer 612 outputs the fourth input data signal_Data 4. For example, at half cycles of the second given cycle cy2 (first given cycle cy1), the fifth multiplexer 612 switches the output of the third input data signal_Data 3 and the output of the fourth input data signal_Data 4. Further, for example, if the value of the third clock signal I2 is 1, the fifth multiplexer 612 outputs the signal output from the seventh latch group 623, and if the value of the third clock signal I2 is 0, the fifth multiplexer 612 outputs the signal from the eighth latch group 624. The signal output from the fifth multiplexer 612 is regarded as D34. In the timing chart 700-1, the third input data signal_Data 3 and the fourth input data signal_Data 4 are alternately output at each first given cycle cy1 as the signal D34.

At each second given cycle cy2, the ninth latch group 625 stores and outputs to the sixth multiplexer 613, a fifth input data signal_Data5. For example, the ninth latch group 625 is a D-FF 637. The D-FF 637 stores the fifth input data signal_Data5 at the rising edge of the fourth clock signal Q2. The signal output from the ninth latch group 625 is regarded as d5. In the timing chart 700-1, the data C1 and the data C2 are input at the second given cycle cy2 as the fifth input data signal_Data5.

At each second given cycle cy2, the tenth latch group 626 outputs a sixth input data signal_Data6 at a timing that is delayed by a half cycle of the second given cycle cy2 relative to the timing at which the ninth latch group 625 outputs the fifth input data signal_Data5. For example, the tenth latch group 626 has a D-FF 638 and a D latch 639. At the rising edge of the fourth clock signal Q2, the D-FF 638 stores the sixth input data signal_Data6 and the D latch 639 latches the signal output from the D-FF 638. The signal output from the tenth latch group 626 is regarded as d6. In the timing chart 700-1, a data G1 and a data G2 are input at the second given cycle cy2 as the sixth input data signal_Data6.

After outputting the fifth input data signal_Data5, the sixth multiplexer 613 outputs the sixth input data signal_Data6. For example, at half cycles of the second given cycle cy2 (first given cycle cy1), the sixth multiplexer 613 switches the output of the fifth input data signal_Data5 and the output of the sixth input data signal_Data6. Further, for example, if the value of the third clock signal I2 is 1, the sixth multiplexer 613 outputs the signal output from the ninth latch group 625; and if the value the third clock signal I2 is 0, outputs the signal output from the tenth latch group 626. The signal output from the sixth multiplexer 613 is regarded as D56. In the timing chart 700-1, the fifth input data signal_Data5 and the sixth input data signal_Data6 are alternately output at each first given cycle cy1 as the signal D56.

At the second given cycle cy2, the eleventh latch group 627 stores and outputs to the seventh multiplexer 614, a seventh input data signal_Data7. For example, the eleventh latch group 627 is a D-FF 640. The D-FF 640 stores the seventh input data signal_Data7 at the rising edge of the fourth clock signal Q2. The signal output from the eleventh latch group 627 is regarded as d7. In the timing chart 700-1, the data D1 and the data D2 are input at the second given cycle cy2 as the seventh input data signal_Data7.

At each second given cycle cy2, the twelfth latch group 628 outputs an eighth input data signal_Data8 at a timing that is delayed by a half cycle of the second given cycle cy2 relative to the timing at which the eleventh latch group 627 outputs the seventh input data signal_Data7. For example, the twelfth latch group 628 has a D-FF 641 and a D latch 642. At the rising edge of the fourth clock signal Q2, the D-FF 641 stores the eighth input data signal_Data8 and the D latch 642 latches the signal output from the D-FF 641. The signal output from the twelfth latch group 628 is regarded as d8. In the timing chart 700-1, a data H1 and a data H2 are input at the second given cycle cy2 as the eighth input data signal_Data8.

After outputting the seventh input data signal_Data7, the seventh multiplexer 614 outputs the eighth input data signal_Data8. For example, at half cycles of the second given cycle cy2 (first given cycle cy1), the seventh multiplexer 614 switches the output of the seventh input data signal_Data7 and the output of the eighth input data signal_Data8. Further, for example, if the value of the third clock signal I2 is 1, the seventh multiplexer 614 outputs the signal output from the eleventh latch group 627 and if the value of the third clock signal I2 is 0, the seventh multiplexer 614 outputs the signal output from the twelfth latch group 628. The signal output from the seventh multiplexer 614 is regarded as D78. In the timing chart 700-1, the seventh input data signal_Data7 and the eighth input data signal_Data8 are alternately output at each first given cycle cy1 as the signal D78.

Thus, in the multiplexer 601, the 4 signals output from the fourth to the seventh multiplexers 611-614 are input to the parallel-to-serial converter circuit 100 as 4 parallel input data signals. Therefore, a combination of the multiplexer 601 and the parallel-to-serial converter circuit 100 enables the frequency of the clock provided to the multiplexer farthest downstream to be reduced even if the number of parallel input data signals is increased.

In a third example, a parallel-to-serial converter circuit will described that can reduce the frequency of the clock provided to the multiplexer farthest downstream, when staged multiplexing by multiplexers that convert 2 parallel signals into a serial signal is performed to convert $2^N$ parallel input data signals into a serial signal.

Figure 9:
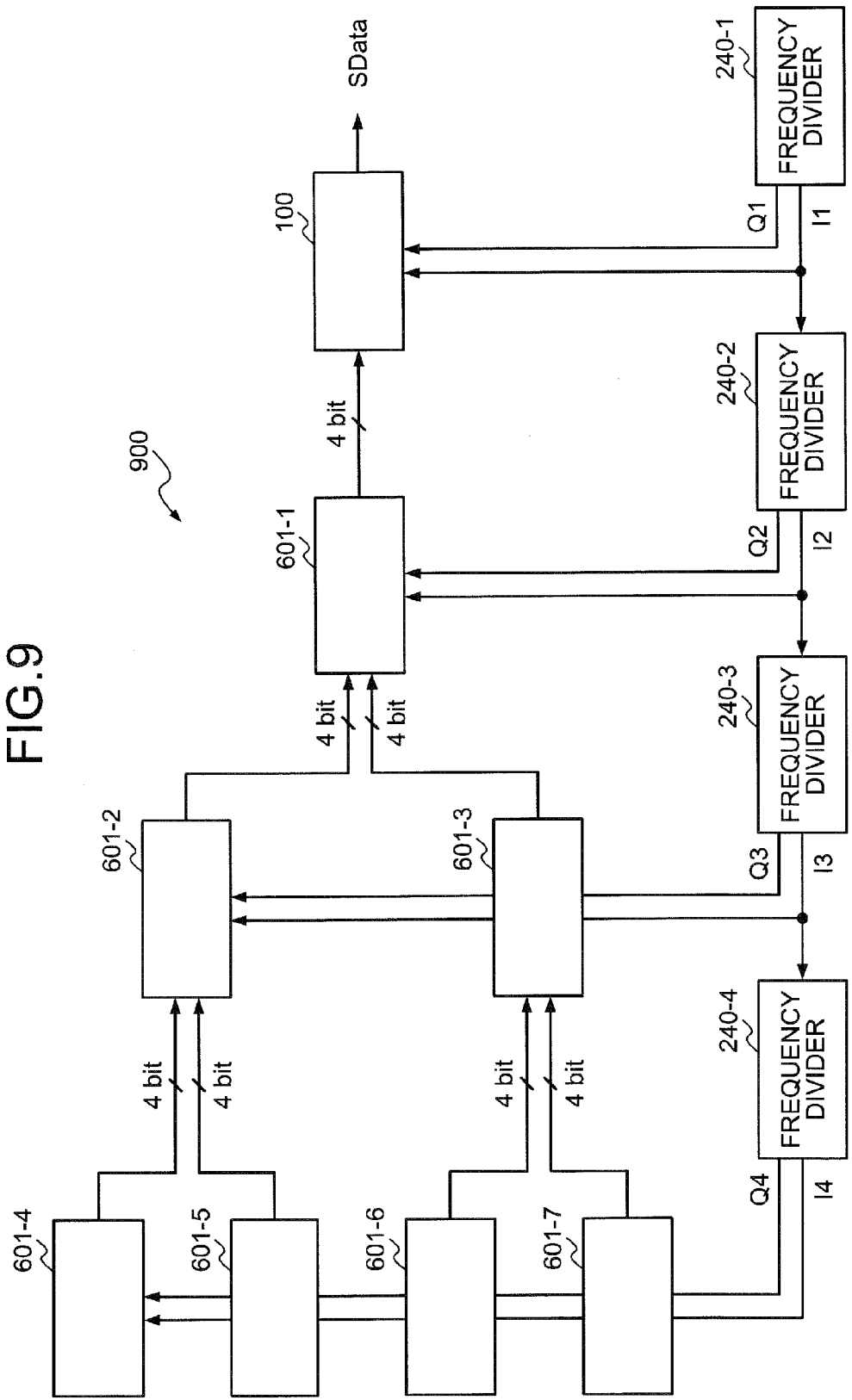
FIG. 9 is a diagram of the parallel-to-serial converter circuit according to a third example.

FIG. 9 is a diagram of the parallel-to-serial converter circuit according to the third example. A parallel-to-serial converter circuit 900 converts into a serial signal, $2^N$ parallel input data signals whose data changes at cycles of (N−1)×the first given cycle. With reference to FIG. 9, an example in which N=5 will be described.

The $2^N$ parallel input data signals are separated forming 8 parallel input data signals. The parallel-to-serial converter circuit 900 is equipped with multiple stages of the multiplexer 601 described in the second example and thereby, performs staged multiplexing into 4 parallel input data signals. The multi-multiplexer parallel-to-serial converter circuit is assumed to be the parallel-to-serial converter circuit 100 that converts 4 parallel input data signals into the serial data signal_SData as described in the first example.

As a result, the frequency of the clock provided to the multiplexer that is farthest downstream and that converts 2 parallel signals into a serial signal can be reduced even when the number of input data signals is great. Consequently, the accuracy of operation at a low voltage can be improved.

Each of the parallel-to-serial converter circuits described in the first to the third examples, for example, are used when parallel data in a transmission apparatus is converted into serial data.

Here, as a subject for comparison with each of the parallel-to-serial converter circuits 100 of the first to the third examples, a multiplexer having a large number of stacked tiers is described.

Figure 10:
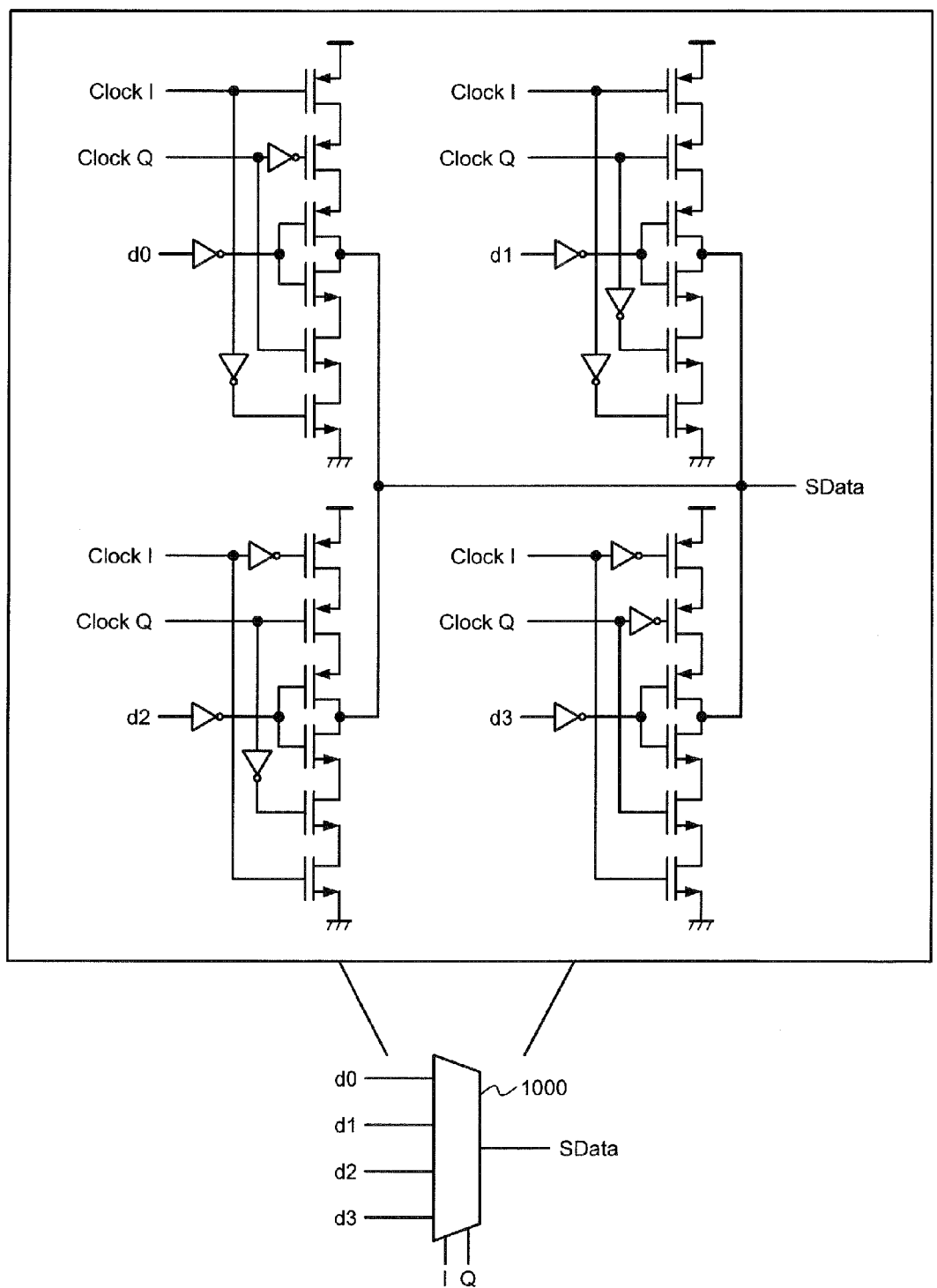
FIG. 10 is a diagram depicting an example of a case of a large number of stacked tiers.

FIG. 10 is a diagram depicting an example of a case of a large number of stacked tiers. A multiplexer 1000 depicted in FIG. 10 has a function of converting 4 parallel data input signals into a serial signal. With the multiplexer 1000 depicted in FIG. 10, the frequency of the clock signal can be reduced similar to the multiplexer 200 in the first example, but on the other hand, the multiplexer 1000 depicted in FIG. 10 has 6 stacked tiers, while the multiplexer 200 in the first example has 4 stacked tiers of transistors.

With a multiplexer that, does not perform staged multiplexing such as the multiplexer 1000 depicted in FIG. 10, the greatest number of tiers exceeds that in a case where multiple multiplexers that convert 2 parallel input data signals are disposed and staged multiplexing is performed. Even if the accuracy of each transistor is identical, the accuracy of transistor operation decreases according to the number of tiers. Therefore, since the multiplexer 200 of the first example has fewer tiers of transistors than the multiplexer 1000, when the voltage decreases, the accuracy of operation increases.

As described, with the parallel-to-serial converter circuit of the first example, when first to fourth input data signals are multiplexed into a serial signal by a multistage configuration of three 2:1 multiplexers, the first input data signal and the second input data signal are multiplexed. Further, with the multiplexer of the first example, the third input data signal and the fourth input data signal are multiplexed. The multiplexers of the first example pass the signals sequentially from the first to the fourth input data signals, to the multiplexer farthest downstream and when doing so the second input data signal and the third input data signal are at the same timing As a result, each time the multiplexer farthest downstream switches the output source, 2 input signals among the 4 input signals can be output. Consequently, the frequency of the clock provided to the multiplexer farthest downstream can be reduced and the operation accuracy of the multiplexer can be improved. For example, the accuracy of low voltage operation can be improved.

With the parallel-to-serial converter circuit of the first example, each multiplexer switches the output of 2 parallel input data signals, at half cycles of the given cycle. The frequency of the clock provided to the multiplexer farthest downstream can be made to be identical to the frequency of the upstream clock.

Further, with the parallel-to-serial converter circuit of the first example, before the data input signals are provided to the multiplexer as each stage, the timing of the signals is staggered based on the first clock signal of the given cycle and the second clock signal, which is of the given cycle and differs in phase from the first clock signal. Consequently, the multiplexer farthest downstream can output the data of 2 signals at each switching of the output source of the multiplexer. Consequently, the frequency of the clock provided to the multiplexer farthest downstream can be reduced.

The parallel-to-serial converter circuit of the first example staggers the timing of the signals, based on the second clock signal whose phase differs by 90 degrees (¼ cycle) from that of the first elect signal of the given cycle. As a result, when the data of the 4 signals is output from the multiplexer farthest downstream, the output periods of the data can be made constant. Furthermore, if a 90-degree phase converter converts the phase of a high frequency clock, the accuracy of the 90-degree phase converter may become unstable. Therefore, the ability to reduce the frequency of the downstream clock by the multiplexer of the first example enables the accuracy of the operation of the 90-degree phase converter to be improved.

With the parallel-to-serial converter circuit of the third example, when 8 parallel input data signals are converted into a serial signal, the 8 parallel input data signals are converted into 4 parallel input data signals by multiplexers that convert 2 parallel signals into a serial signal. Further, with the parallel-to-serial converter circuit of the third example, the 4 parallel input data signals are converted into a serial signal by the multiplexer of the first example. As a result, since the multiplexer of the first example can be used without modifying the configuration thereof, the frequency of the clock provided to the multiplexer farthest downstream can be reduced, even if the number of input data signals increases. Furthermore, since the multiplexer converts 2 parallel signals into a serial signal, the number of tiers of transistors does not increase beyond 4 and consequently, the accuracy of low voltage operation can be improved.

According to the embodiments, the frequency of a clock provided to a multiplexer can be reduced.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention nave been described in detail, it should be understood that the various changes, substitutions, and alterations could be made hereto without departing from the spirit and scope of the invention.

What is claimed is:

1. A parallel-to-serial converter circuit that converts parallel first to fourth input data signals into a serial signal, the parallel-to-serial converter circuit comprising:
   a first latch group that based on a first clock signal of a given cycle, outputs the first input data signal at a first timing of the given cycle;
   a second latch group that outputs the second input data signal at a second timing that is of the given cycle and delayed by half a cycle of the given cycle relative to the first timing;
   a third latch group that outputs the third input data signal at the second timing;
   a fourth latch group that outputs the fourth input data signal at a third timing that is of the given cycle and delayed by one given cycle relative to the first timing;
   a first multiplexer that at each given cycle and based on a second clock signal having a phase that differs by ¼ cycle from the phase of the first clock signal, outputs the second input data signal, after outputting the first input data signal;
   a second multiplexer that at each given cycle and based on the second clock signal, outputs the fourth input data signal, after outputting the third input data signal and that outputs the third input data signal at a timing that coincides with the timing at which the second input data signal is output from the first multiplexer; and
   a third multiplexer that at each given cycle and based on the first clock signal, outputs the third and the fourth input data signals output from the second multiplexer, after outputting the first and the second input data signals output front the first multiplexer.

2. The parallel-to-serial converter circuit according to claim 1, wherein
   the first multiplexer switches at half cycles of the given cycle, output of the first input data signal and output of the second input data signal,
   the second multiplexer switches at half cycles of the given cycle, output of the third input data signal and output the fourth input data signal, and
   the third multiplexer switches at half cycles of the given cycle, output of a signal that is from the first multiplexer and output of a signal that is from the second multiplexer.

3. The parallel-to-serial converter circuit according to claim 1, wherein
   the first multiplexer, at each half cycle of the given cycle and according to the second clock signal that is of the given cycle and has a phase differing from the phase of the first clock signal, alternates output of the first input data signal that is from the first latch group and output of the second input data signal that is from the second latch group,
   the second multiplexer, at each half cycle of the given cycle and according to the second clock signal, alternates output of the third input data signal that is from the third latch group and output of the fourth input data signal that is from the fourth latch group, and
   the third multiplexer, at each half cycle of the given cycle and according to the first clock signal, alternates output of a signal that is from the first multiplexer and output of a signal that is from the second multiplexer.

4. The parallel-to-serial converter circuit according to claim 1, wherein
   the second clock signal is a signal having a phase that differs from the phase of the first clock signal by 90 degrees.

5. The parallel-to-serial converter circuit according to claim 1, when parallel signals including fifth to twelfth input data signals, respectively having data changing at a second given cycle that is twice the given cycle, are converted into a serial signal, the parallel-to-serial converter circuit further comprising:
   a fourth multiplexer that at each second given cycle, outputs the sixth input data signal, after outputting the fifth input data signal;
   a fifth multiplexer that at each second given cycle, outputs the eighth input data signal, after outputting the seventh input data signal;
   a sixth multiplexer that at each second given cycle, outputs a tenth input data signal, after outputting a ninth input data signal; and
   a seventh multiplexer that at each second given cycle, outputs the twelfth input data signal, after outputting the eleventh input data signal, wherein
   the first multiplexer switches at half cycles of the given cycle, output of a signal that is from the fourth multiplexer and output of a signal that is from the fifth multiplexer, and
   the second multiplexer switches at half cycles of the given cycle, output of a signal that is from the sixth multiplexer and output of a signal that is from the seventh multiplexer.

* * * * *